(12) United States Patent
Yang et al.

(10) Patent No.: US 9,467,250 B2
(45) Date of Patent: Oct. 11, 2016

(54) APPARATUS AND METHOD FOR TRANSMITTING/RECEIVING PACKET IN BROADCASTING AND COMMUNICATION SYSTEM

(71) Applicant: Samsung Electronics Co. Ltd., Suwon-si, Gyeonggi-do (KR)

(72) Inventors: Hyun-Koo Yang, Seoul (KR); Sung-Hee Hwang, Suwon-si (KR); Seho Myung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 471 days.

(21) Appl. No.: 13/937,505

(22) Filed: Jul. 9, 2013

(65) Prior Publication Data

US 2014/0019829 A1   Jan. 16, 2014

(30) Foreign Application Priority Data

Jul. 12, 2012   (KR) ........................ 10-2012-0076132

(51) Int. Cl.
| | |
|---|---|
| *H03M 13/00* | (2006.01) |
| *H04L 1/00* | (2006.01) |
| *H03M 13/37* | (2006.01) |
| *H03M 13/11* | (2006.01) |
| *H03M 13/15* | (2006.01) |
| *H03M 13/29* | (2006.01) |

(52) U.S. Cl.
CPC ............ *H04L 1/004* (2013.01); *H03M 13/373* (2013.01); *H03M 13/6356* (2013.01); *H03M 13/6508* (2013.01); *H04L 1/0041* (2013.01); *H04L 1/0045* (2013.01); *H04L 1/0057* (2013.01); *H03M 13/1102* (2013.01); *H03M 13/1515* (2013.01); *H03M 13/2957* (2013.01); *H04L 1/0083* (2013.01)

(58) Field of Classification Search
CPC . H04L 1/0057; H04L 1/0061; H04L 1/0041; H04L 1/0083; H04L 1/0072
USPC ........................................................ 714/776
See application file for complete search history.

(56) References Cited

U.S. PATENT DOCUMENTS

| | | | | |
|---|---|---|---|---|
| 6,771,674 | B1 * | 8/2004 | Schuster ............... | H04L 1/0041 370/537 |
| 8,276,035 | B1 * | 9/2012 | Savarese ............... | H04L 1/0007 714/749 |

(Continued)

FOREIGN PATENT DOCUMENTS

| | | |
|---|---|---|
| KR | 10-2008-0084369 A | 9/2008 |
| WO | 2006/078836 A1 | 7/2006 |
| WO | 2008/013528 A1 | 1/2008 |

*Primary Examiner* — Albert Decady
*Assistant Examiner* — Enam Ahmed
(74) *Attorney, Agent, or Firm* — Jefferson IP Law, LLP

(57) ABSTRACT

A method for transmitting a packet by a signal transmission apparatus in a broadcasting and communication system is provided. The method includes generating a Forward Error Correction (FEC) packet including an FEC parity packet and an FEC source packet by encoding source payloads using an FEC encoding scheme, and transmitting the FEC packet to a signal reception apparatus, wherein the FEC parity packet is generated using a plurality of Source Sub-Blocks (SSBs) which are generated using specific source payloads selected corresponding to a preset SSB generation scheme from among the source payloads included in a source block, and wherein the FEC source packet is generated using the source payloads.

34 Claims, 7 Drawing Sheets

(56) References Cited

U.S. PATENT DOCUMENTS

| | | |
|---|---|---|
| 2006/0077890 A1 | 4/2006 | Suryavanshi et al. |
| 2009/0089535 A1 | 4/2009 | Lohmar et al. |
| 2010/0050057 A1 | 2/2010 | Luby |
| 2011/0219279 A1 | 9/2011 | Abu-Surra et al. |
| 2013/0051479 A1* | 2/2013 | Won ............... H04N 21/234327 375/240.27 |

* cited by examiner

APPARATUS AND METHOD FOR TRANSMITTING/RECEIVING PACKET IN BROADCASTING AND COMMUNICATION SYSTEM

PRIORITY

This application claims the benefit under 35 U.S.C. §119 (a) of a Korean patent application filed on Jul. 12, 2012 in the Korean Intellectual Property Office and assigned Serial No. 10-2012-0076132, the entire disclosure of which is hereby incorporated by reference.

TECHNICAL FIELD

The present disclosure relates to an apparatus and method for transmitting/receiving a packet in a broadcasting and communication system. More particularly, the present disclosure relates to an apparatus and method for transmitting/receiving a packet using a Source Sub-Block (SSB) in a broadcasting and communication system.

BACKGROUND

A broadcasting and communication system, for example, a Moving Picture Experts Group (MPEG) Media Transport (MMT) system provides various large-capacity content such as High Definition (HD) content, Ultra High Definition (UHD) content, and the like.

According to diversification of content and increases in large-capacity content such as HD content and UHD content on a multimedia communication system, data congestion has become more serious on a network. Due to such a condition, content transmitted by a signal transmission device (e.g., a host A) is not completely transferred to a signal reception device (e.g., a host B) and some of the content is lost en route.

In general, data is transmitted on a packet basis, and accordingly data loss is generated on a transmission packet basis. Accordingly, if the transmission packet is lost on a network, the signal reception device cannot receive the lost transmission packet, and thus cannot know data within the lost transmission packet. As a result, a user may be inconvenienced. For example, the user may experience audio signal quality deterioration, video picture quality deterioration, video picture break, caption omission, file loss, and the like.

In view of the above, there is a need for a scheme for repairing data loss occurred on a network.

If data is lost on the network, one of schemes which support repair of data lost in a signal reception apparatus is a scheme in which a source block is generated using a preset number of data packets which may have various lengths referred to as a source packet, and repair information including information such as, for example, parity data or a repair packet is added to the source block through a Forward Error Correction (FEC) encoding.

In the scheme described above, upon detecting that data loss occurs, the signal reception apparatus may perform a decoding operation using the repair information. Packets including a plurality of content which require different transmission reliability may be included in one source block. In this case, if an amount of repair packets necessary for one source block is determined based on a packet which requires the highest reliability among packets included in the source packet, then packets which require low reliability among the packets included in the source packet are overprotected thereby decreasing a network efficiency. In contrast, if amount of repair packets necessary for one source block is determined based on a packet which requires the lowest reliability among the packets included in the source packet, then packets which require high reliability among the packets included in the source packet may not be repaired.

However, in a current broadcasting and communication system, no scheme exists for effectively repairing data loss by effectively considering transmission reliability for packets included in a source block.

Accordingly, in a broadcasting and communication system, there is a need for a scheme for effectively repairing data loss by effectively considering transmission reliability for packets included in a source block.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to propose an apparatus and method for transmitting/receiving a packet in a broadcasting and communication system.

Another aspect of the present disclosure is to provide an apparatus and method for transmitting/receiving a packet using an Source Sub-Block (SSB) in a broadcasting and communication system.

Another aspect of the present disclosure is to provide an apparatus and method for transmitting/receiving a packet in a broadcasting and communication system thereby increasing data repair efficiency.

Another aspect of the present disclosure is to provide an apparatus and method for transmitting/receiving a packet in a broadcasting and communication system thereby acquiring effective transmission reliability.

In accordance with an aspect of the present disclosure, a method for transmitting a packet by a signal transmission apparatus in a broadcasting and communication system is provided. The method includes generating a Forward Error Correction (FEC) packet including an FEC parity packet and an FEC source packet by encoding source payloads using an FEC encoding scheme, and transmitting the FEC packet to a signal reception apparatus, wherein the FEC parity packet is generated using a plurality of Source Sub-Blocks (SSBs) which are generated using specific source payloads selected corresponding to a preset SSB generation scheme from among the source payloads included in a source block, and wherein the FEC source packet is generated using the source payloads.

In accordance with another aspect of the present disclosure, a method for receiving a packet by a signal reception apparatus in a broadcasting and communication system is provided. The method includes receiving an FEC packet including an FEC parity packet and an FEC source packet from a signal transmission apparatus, wherein the FEC parity packet is generated using a plurality of SSBs which are generated using specific source payloads selected corresponding to a preset SSB generation scheme from among the source payloads included in a source block, and wherein the FEC source packet is generated using the source payloads.

In accordance with another aspect of the present disclosure, a signal transmission apparatus in a broadcasting and communication system is provided. The signal transmission apparatus includes an FEC encoding block configured to generate an FEC packet including an FEC parity packet and an FEC source packet by encoding source payloads using an FEC encoding scheme, and a transmitter configured to transmit the FEC packet to a signal reception apparatus, wherein the FEC parity packet is generated using a plurality of SSBs which are generated using specific source payloads selected corresponding to a preset SSB generation scheme from among the source payloads included in a source block, and wherein the FEC source packet is generated using the source payloads.

In accordance with another aspect of the present disclosure, a signal reception apparatus in a broadcasting and communication system is provided. The signal reception apparatus includes a receiver configured to receive an FEC packet including an FEC parity packet and an FEC source packet from a signal transmission apparatus, wherein the FEC parity packet is generated using a plurality of SSBs which are generated using specific source payloads selected corresponding to a preset SSB generation scheme from among the source payloads included in a source block, and wherein the FEC source packet is generated using the source payloads.

Other aspects, advantages, and salient features of the disclosure will become apparent to those skilled in the art from the following detailed description, which, taken in conjunction with the annexed drawings, discloses embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
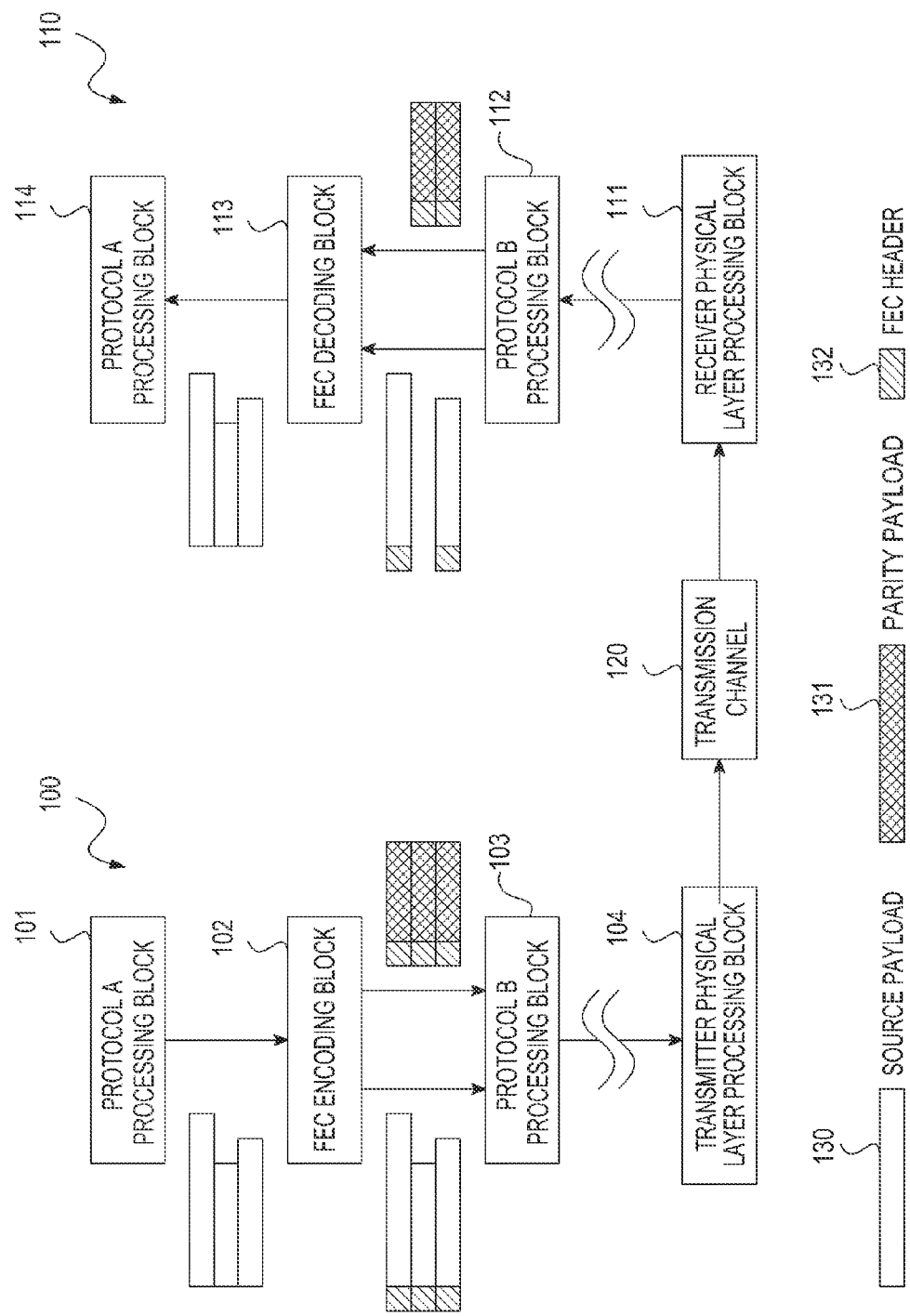
FIG. 1 schematically illustrates a structure of a broadcasting and communication system according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present disclosure proposes an apparatus and method for transmitting/receiving a packet in a broadcasting and communication system.

The present disclosure proposes an apparatus and method for transmitting/receiving a packet using a Source Sub-Block (SSB) in a broadcasting and communication system.

The present disclosure proposes an apparatus and method for transmitting/receiving a packet in a broadcasting and communication system thereby increasing data recovery efficiency.

The present disclosure proposes an apparatus and method for transmitting/receiving a packet in a broadcasting and communication system thereby acquiring effective transmission reliability.

Embodiments of the present disclosure will be described below with reference to a broadcasting and communication system such as, for example, a Moving Picture Experts Group (MPEG) Media Transport (MMT) system. However, it will be understood by those of ordinary skill in the art that the broadcasting and communication system may be any one of an Evolved Packet System (EPS), a Long-Term Evolution (LTE) mobile communication system, a Long-Term Evolution Advanced (LTE-A) mobile communication system, and an Institute of Electrical and Electronics Engineers (IEEE) 802.16m communication system and the like, as well as the MMT system.

In various embodiments of the present disclosure a packet transmission/reception apparatus and method for effectively repairing data packet loss in electronic devices are proposed. According to various embodiments of the present disclosure, electronic devices may include a portable telephone, a Television (TV), a computer, an electronic bulletin board, a tablet, an electronic book, a Personal Digital Assistant (PDA), a Portable/Personal Multimedia Player (PMP), a laptop Personal Computer (PC), a digital camera, an MP3 player, a portable game console, a set-top box, which may provide various multimedia services such as a videoconferencing/video call as well as large-capacity content such as High Definition (HD) content, Ultra High Definition (UHD) content, and the like.

In various embodiments of the present disclosure a packet transmission/reception apparatus and method for enhancing a Forward Error Correction (FEC) decoding performance or increasing transmission efficiency by dividing a source block into a plurality of SSBs and effectively generating an information block and information sub-block upon applying an FEC scheme is proposed.

Although a detailed FEC encoding scheme will not be described in various embodiments of the present disclosure, it will be understood by those of ordinary skill in the art that the FEC encoding scheme is not limited as a specific FEC encoding scheme such as a Reed-Solomon (RS) code, a Low Density Parity Check (LDPC) code, a turbo code, a RaptorQ code, a XOR (Single Parity-Check Code) code, a Pro-Moving Picture Experts Group (MPEG) FEC code, and the like.

FIG. 1 schematically illustrates a structure of a broadcasting and communication system according to an embodiment of the present disclosure.

Referring to FIG. 1, the broadcasting and communication system includes a signal transmission apparatus 100 and a signal reception apparatus 110.

The signal transmission apparatus 100 includes a protocol A processing block 101, an FEC encoding block 102, a protocol B processing block 103, and a transmitter physical layer processing block 104. The protocol B processing block 103 performs a protocol B processing operation corresponding to a protocol B as an FEC lower protocol.

According to various embodiments of the present disclosure, the protocol A processing block 101 performs a protocol A processing operation corresponding to a protocol A as an FEC upper protocol. The protocol A processing block 101 generates source payloads 130 by performing a protocol A processing operation on transmission data, and outputs the source payloads 130 to the FEC encoding block 102.

The FEC encoding block 102 generates a source block including at least one source payload, and generates parity payloads 131 by performing an FEC encoding operation corresponding to a preset or selected FEC encoding scheme on the source block. The number of source payloads included in the source block may be changeable, and a detailed description of the number of source payloads included in the source block will be omitted.

The FEC encoding block 102 generates an FEC source packet by adding FEC headers 132 to the source payloads 130, and transfers the FEC source packet to the protocol B processing block 103. The FEC source packet denotes an FEC packet including a source payload and an FEC header. One FEC source packet may include a plurality of source payloads. For convenience, it will be assumed that one FEC source packet includes one source payload.

The FEC encoding block 102 generates an FEC parity packet by adding the FEC headers 132 to the parity payloads 131, and transfers the FEC parity packet to the protocol B processing block 103. The FEC parity packet denotes an FEC packet including a parity payload and an FEC header. One FEC parity packet may include a plurality of parity payloads. For convenience, it will be assumed that one FEC parity packet includes one parity payload.

According to various embodiments of the present disclosure, the protocol B processing block 103 performs a protocol B processing operation corresponding to a protocol B as an FEC lower protocol. The protocol B processing block 103 generates a protocol B signal by performing a protocol B processing operation corresponding to the protocol B on the FEC source packet or the FEC parity packet transferred from the FEC encoding block 102, and transfers the protocol B signal to the transmitter physical layer processing block 104.

The transmitter physical layer processing block 104 converts the protocol B signal transferred from the protocol B processing block 103 into a physical layer signal which is appropriate for physical layer transmission, and transmits the physical layer signal to the signal reception apparatus 110.

According to various embodiments of the present disclosure, signal transmission apparatus 100 may include various processing blocks between the protocol B processing block 103 and the transmitter physical layer processing block 104 in FIG. 1. However, a detailed description of the various processing blocks will be omitted.

Although the protocol A processing block 101, the FEC encoding block 102, the protocol B processing block 103, and the transmitter physical layer processing block 104 are shown in FIG. 1 as separate units, it is to be understood that such an illustration is for merely convenience of description. In other words, two or more of the protocol A processing block 101, the FEC encoding block 102, the protocol B processing block 103, and the transmitter physical layer processing block 104 may be incorporated into a single unit.

The signal reception apparatus 110 includes a receiver physical layer processing block 111, a protocol B processing block 112, an FEC decoding block 113, and a protocol A processing block 114.

The receiver physical layer processing block 111 converts a physical layer signal received in the signal reception apparatus 110 from the signal transmission apparatus 100 through a transmission channel 120 into a protocol B signal, and transfers the protocol B signal to the protocol B processing block 112. As described above in relation to the signal transmission apparatus 100, the signal reception apparatus 110 may include various processing blocks between the protocol B processing block 112 and the receiver physical layer processing block 111 in FIG. 1. However, a detailed description of the various processing blocks will be omitted.

According to various embodiments of the present disclosure, the protocol B processing block 112 performs a protocol B processing operation corresponding to the protocol B. The protocol B processing block 112 generates a protocol B signal by performing a protocol B processing operation on a physical layer signal received in the protocol B processing block 112, and transfers the protocol B signal to the FEC decoding block 113. The protocol B signal may be an FEC packet (e.g., an FEC source packet or an FEC parity packet). Some of FEC packets transmitted from the signal transmission apparatus 100 may be lost as a result of an effect of network congestion, an occurrence of an error on a physical layer, and the like. Consequently, some of the FEC packets transmitted from the signal transmission apparatus 100 may not transferred to the FEC decoding block 113.

The FEC decoding block 113 detects source payloads transmitted from the signal transmission apparatus 100 by performing an FEC decoding operation on an FEC packet transferred from the protocol B processing block 112, and transfers the detected source payloads to the protocol A processing block 114.

According to various embodiments of the present disclosure, the protocol A processing block 114 performs a protocol A processing operation corresponding to the protocol A. The protocol A processing block 114 detects transmission data by performing a protocol A processing operation on source payloads transferred from the FEC decoding block 113.

Although the receiver physical layer processing block 111, the protocol B processing block 112, the FEC decoding block 113, and the protocol A processing block 114 are shown in FIG. 1 as separate units, it is to be understood that such an illustration is for merely convenience of description. In other words, two or more of the receiver physical layer processing block 111, the protocol B processing block 112, the FEC decoding block 113, and the protocol A processing block 114 may be incorporated into a single unit.

Figure 2:
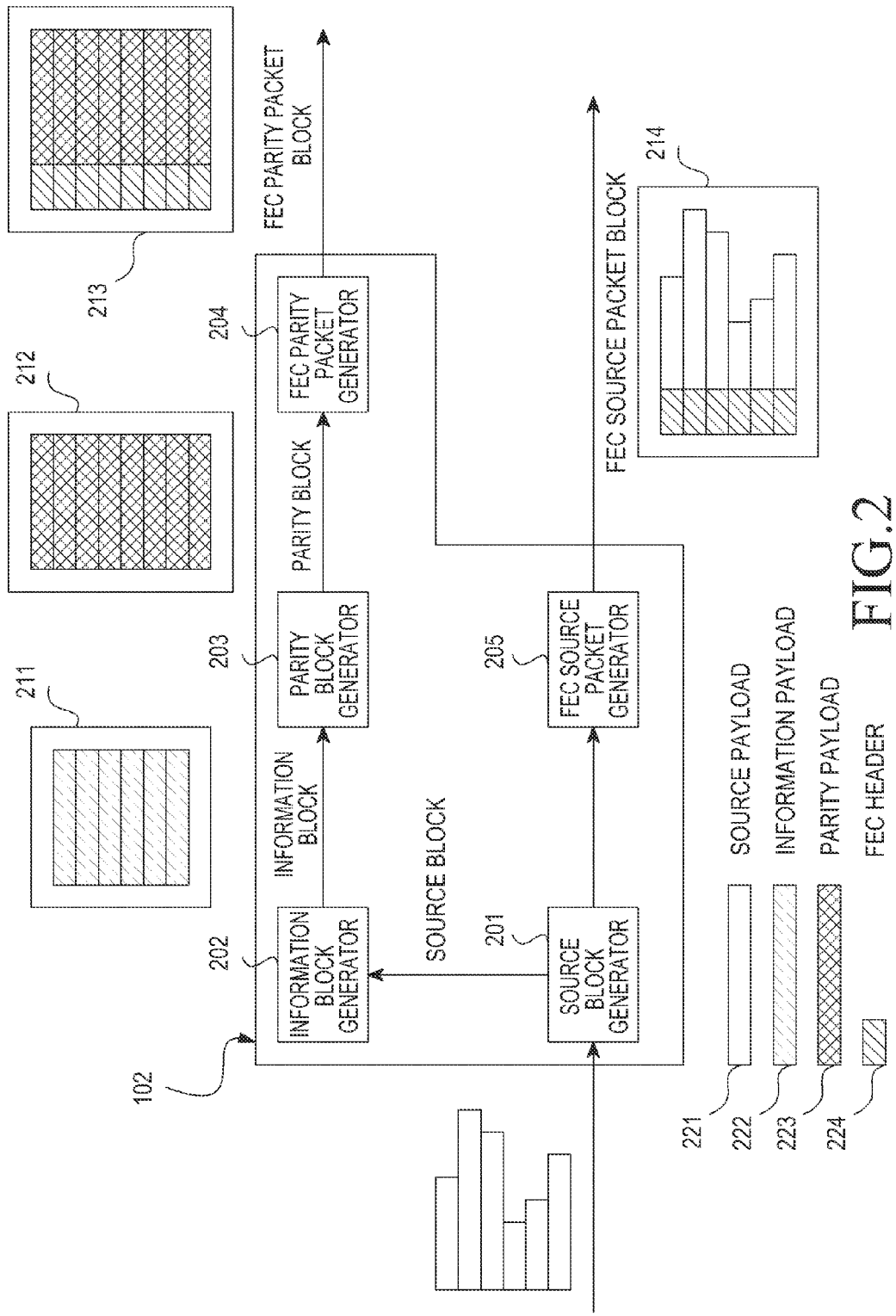
FIG. 2 schematically illustrates an example of an inner structure of a Forward Error Correction (FEC) encoding block in a signal transmission apparatus such as, for example, the signal transmission apparatus illustrated in FIG. 1 according to an embodiment of the present disclosure.

FIG. 2 schematically illustrates an example of an inner structure of an FEC encoding block in a signal transmission apparatus such as, for example, the signal transmission apparatus illustrated in FIG. 1 according to an embodiment of the present disclosure.

Referring to FIG. 2, the FEC encoding block 102 includes a source block generator 201, an information block generator 202, a parity block generator 203, an FEC parity packet generator 204, and an FEC source packet generator 205.

The source block generator 201 inputs source payloads 221, generates a source block using the source payloads 221, and transfers the source block to the information block generator 202 and the FEC source packet generator 205. The number of source payloads 221 included in the source block may be changeable, and lengths of the source payloads 221 may vary among source blocks. A detailed description of the number of source payloads 221 included in the source block and lengths of the source payloads 221 will be omitted.

The information block generator 202 inputs the source blocks output from the source block generator 201, generates an information word block 211 by sequentially arranging source payloads 221 included in the source block in a form of a two-dimension array with a preset width T, and outputs the generated information word block 211 to the parity block generator 203. Each row included in the two-dimension array is an information payload 222, and the width T is a payload size. The payload size may be generally expressed by a byte or a bit.

The parity block generator 203 inputs the information word block 211 output from the information block generator 202, generates a parity block 212 by performing an FEC encoding operation on the information word block 211, and transfers the parity block 212 to the FEC parity packet generator 204. The parity block 212 includes a parity payload 223 with a size equal to the size of the information payload 222.

The FEC parity packet generator 204 generates FEC parity packets by adding an FEC header 224 to each of the parity payloads 223 included in the parity block 212 output from the parity block generator 203 and an FEC parity packet block 213 including the generated FEC parity packets. The FEC parity packet generator 204 outputs the FEC parity packet block 213 to a protocol B processing block 103.

The FEC source packet generator 205 generates FEC source packets by adding each of source payloads 221 included in the source block output from the source block generator 201 to the FEC header 224, and generates an FEC source packet block 214 as the generated FEC source packets. The FEC source packet generator 205 outputs the generated FEC source packet block 214. The FEC header which is added to the FEC source packet and the FEC header which is added to the FEC parity packet may be identical or different each other.

Although the source block generator 201, the information block generator 202, the parity block generator 203, the FEC parity packet generator 204, and the FEC source packet generator 205 are shown in FIG. 2 as separate units, it is to be understood that such an illustration is for merely convenience of description. In other words, two or more of the source block generator 201, the information block generator 202, the parity block generator 203, the FEC parity packet generator 204, and the FEC source packet generator 205 may be incorporated into a single unit.

Figure 3:
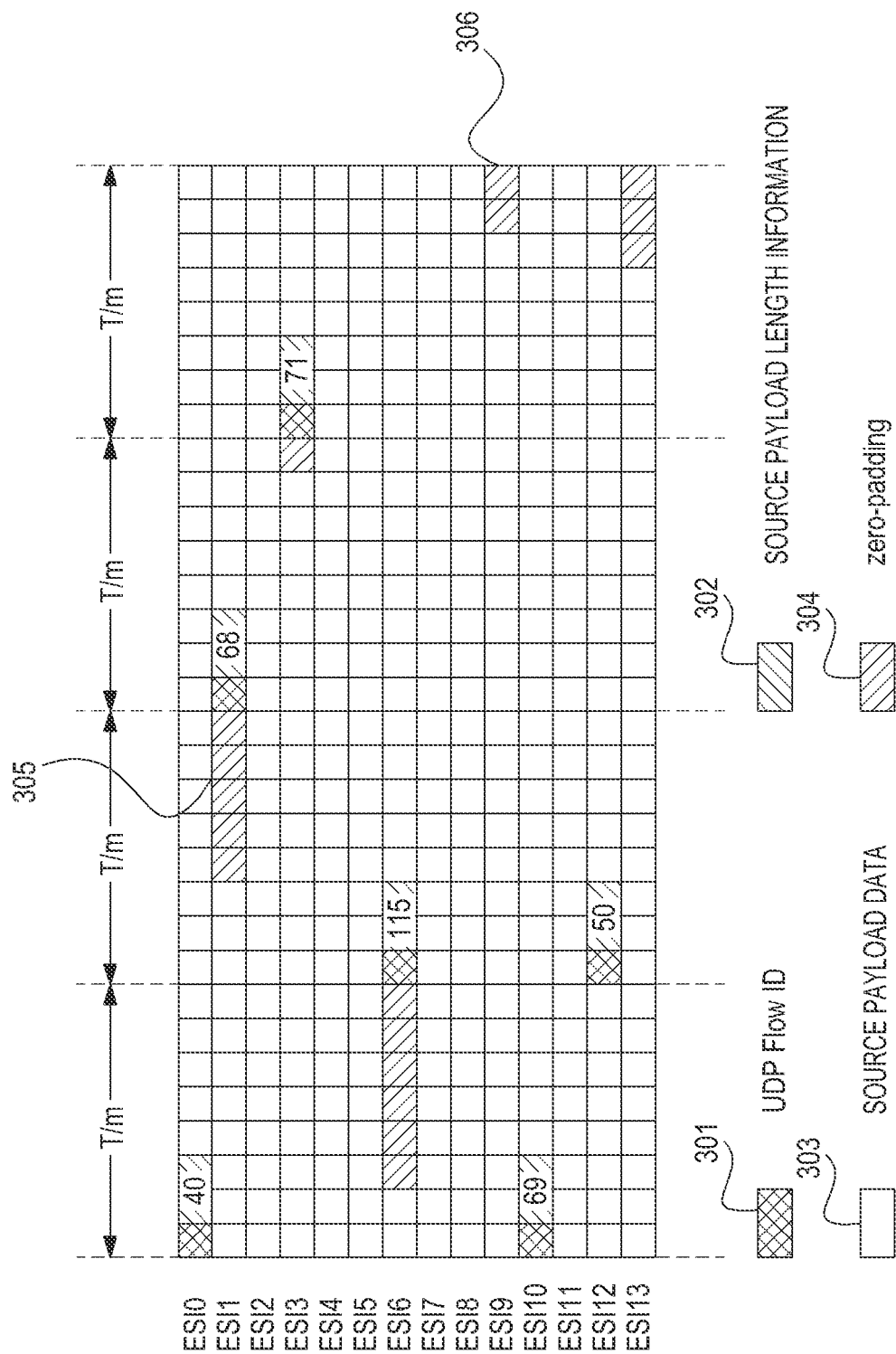
FIG. 3 schematically illustrates a process for generating a source block in a source block generator such as, for example, the source block generator illustrated in FIG. 2 according to an embodiment of the present disclosure.

FIG. 3 schematically illustrates a process for generating a source block in a source block generator such as, for example, the source block generator illustrated in FIG. 2 according to an embodiment of the present disclosure.

Referring to FIG. 3, the source block generator 201 divides a two-dimension array with a symbol size T into m regions by T/m columns. The source block generation process in FIG. 3 assumes that m is 4 (m=4). If the symbol size T is not a multiple of m, the two-dimension array includes regions which include [T/m]+1 columns respectively and regions which include [T/m] columns respectively. For an arbitrary real number, [A] denotes a maximum integer less than or equal to A.

The regions which include [T/m]+1 columns respectively and the regions which include [T/m] columns respectively may be defined by a preset arrangement (or agreement) between a signal transmission apparatus and a signal reception apparatus in advance or may be expressed by arranging the number of columns for each region. For example, the preset arrangement may be defined that first n regions are divided into [T/m]+1 columns and the remaining m-n regions are divided into [T/m] columns if a remainder is n(n<m) in a case that T is divided by m. However, it will be understood by those of ordinary skill in the art that the number of columns included in each region may be different one another according to an arrangement between the signal transmission apparatus and the signal reception apparatus as well as the region division scheme which has a regular format described above.

If necessary, the source block generator 201 adds packet characteristic information 301 such as a User Datagram Protocol (UDP) flow ID and information 302 indicating a length of a source payload to the source payload. Each source payload (e.g., source payload data 303) to which the packet characteristic information (e.g., the UDP flow ID 301) and the source payload length information 302 are added is sequentially arranged from the first column in the first row in order not to exceed the symbol size T.

The source block generator 201 allocates (or sets) a predetermined value to the remaining region within a region to which the last data of a related source payload is allocated in the last row on which an arbitrary source payload to which additional information (e.g., the packet characteristic information 301 and the source payload length information 302 are added) is arranged. According to various embodiments of the present disclosure, the source block generator 201 may always allocate the predetermined value to the remaining region within a region to which the last data of the related source payload is allocated in the last row on which an arbitrary source payload to which addition information is arranged. For convenience, the predetermined value may be "0". However it will be understood by those of ordinary skill in the art that the predetermined value may be another value. For example, in FIG. 3, the source block generator 201 allocates a value 0 to the remaining part 305 of the second region because the last data of the second source payload (e.g., source payload data 303) is allocated to the second region among four regions. For convenience, the packet characteristic information 301 and the source payload length information 302 may be referred to as "additional information".

The next source payload after one source payload to which the additional information is added starts to be arranged from a starting point of a region next to a region in which the last data is allocated in the last low in which the previous source payload is arranged. According to various embodiments of the present disclosure, next source payload after one source payload to which the additional information is added always starts to be arranged from a starting point of a region next to a region in which the last data is allocated in the last low in which the previous source payload is arranged. For example, all source payloads should be allocated from a starting point of an arbitrary region. For example, the second source payload starts to be arranged from a starting point of the third region next to the part 305 in which "0" values are allocated. For convenience, an operation for allocating "0" values is referred to as a zero padding operation. The regions in which "0" values are allocated may be referred to as zero-padding information 304. If a zero padding part such as a zero padding part 306 is allocated to the last region of a related source payload, the fifth source payload as the next source payload starts from the first region of the next row.

As a result, a two-dimension array 212 which is generated after completion of all processes as described above for given source payloads becomes an information block.

Meanwhile, packets including a plurality of content which require different transmission reliability may be included in one source block. In this case, if an amount of repair packets necessary for one source block is determined based on a packet which requires the highest reliability among packets included in the source packet, then packets which require low reliability among the packets included in the source packet are overprotected, thereby decreasing a network efficiency.

In contrast, if amount of recovery packets necessary for one source block is determined based on a packet which requires the lowest reliability among the packets included in the source packet, packets which require high reliability among the packets included in the source packet may not be repaired.

According to various embodiments of the present disclosure, a method for improving a decoding performance or increasing transmission efficiency by dividing a source block into SSBs and effectively generating an information block and information sub-blocks is provided.

Figure 4:
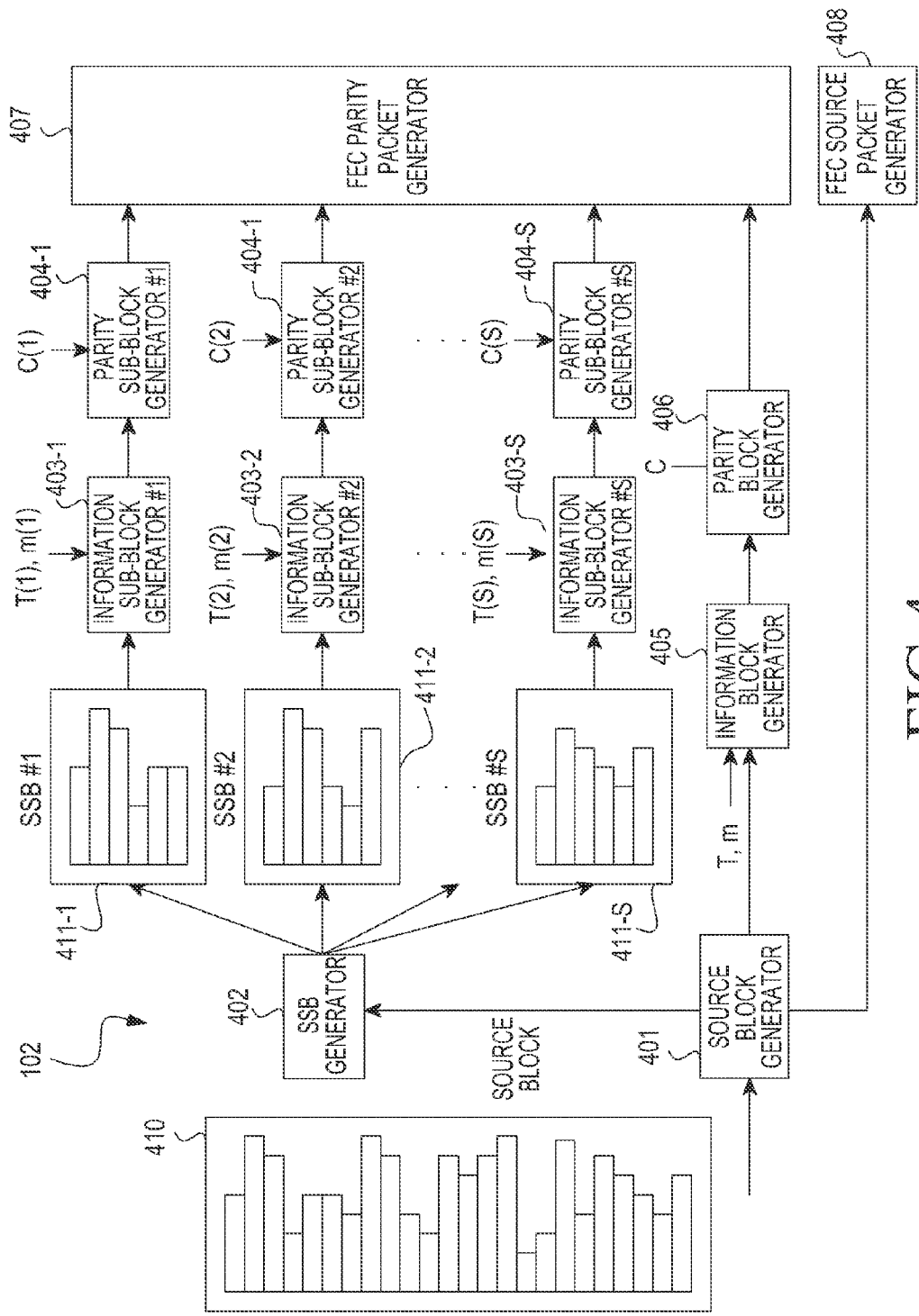
FIG. 4 schematically illustrates an example of an inner structure of an FEC encoding block in a signal transmission apparatus such as, for example, the signal transmission apparatus illustrated in FIG. 1 according to an embodiment of the present disclosure.

FIG. 4 schematically illustrates an example of an inner structure of an FEC encoding block in a signal transmission apparatus such as, for example, the signal transmission apparatus illustrated in FIG. 1 according to an embodiment of the present disclosure.

Referring to FIG. 4, the FEC encoding block 102 includes a source block generator 401, an SSB generator 402, S information sub-block generators (e.g., an information sub-block generator #1 403-1, an information sub-block generator #2 403-2, ..., an information sub-block generator #S 403-S), S parity sub-block generators (e.g., a parity sub-block generator #1 404-1, a parity sub-block generator #2 404-2, ..., a parity sub-block generator #S 404-S), an information block generator 405, a parity block generator 406, an FEC parity packet generator 407, and an FEC source packet generator 408.

The source block generator 401 inputs source payloads, generates a source block 410 including the input source payloads, and outputs the generated source block 410 to the SSB generator 402, the information block generator 405, and the FEC source packet generator 408.

The SSB generator 402 inputs the source block output from the source block generator 401, generates S SSB, (e.g., an SSB #1 411-1, an SSB #2 411-2, ..., an SSB #S 411-S) by selecting the source payloads included in the source block, and outputs each of the SSBs (e.g., SSB #1 411-1, the SSB #2 411-2, ..., the SSB #S 411-S) to a related information sub-block generator (e.g., information sub-block generator #1 403-1, the SSB #2 411-2 to the information sub-block generator #2 403-2, ..., the SSB #S 411-S). For example, the SSB generator 402 outputs the SSB #1 411-1 to the information sub-block generator #1 403-1, the SSB #2 411-2 to the information sub-block generator #2 403-2, ..., the SSB #S 411-S to the information sub-block generator #S 403-S.

Each of the information sub-block generator #1 403-1, the information sub-block generator #2 403-2, ..., the information sub-block generator #S 403-S inputs a related SSB output from the SSB generator 402, and generates an information sub-block by performing an information sub-block generation operation corresponding to a preset information sub-block generation scheme on the related SSB.

Each of the information sub-block generator #1 403-1, the information sub-block generator #2 403-2, ..., the information sub-block generator #S 403-S may perform an operation identical to an operation described in the information block generator 202 in FIG. 2, and a detailed description will be followed.

Each of the information sub-block generator #1 403-1, the information sub-block generator #2 403-2, ..., the information sub-block generator #S 403-S may use a different payload size T and a different number of regions m, and a detailed description will be followed.

It will be assumed that a payload size T and the number of regions m used in the ith information sub-block generator, i.e., an information sub-block generator #i 403-i are T(i) and m(i), respectively, and the number of information payloads included in the ith information sub-block is K(i).

Each of the S parity sub-block generators (e.g., the parity sub-block generator #1 404-1, the parity sub-block generator #2 404-2, ..., the parity sub-block generator #S 404-S) generates a parity sub-block by performing an FEC encoding operation corresponding to a preset FEC encoding scheme on an input information sub-block. A codeword which is generated according to the FEC encoding scheme will be called as an FEC codeword. It will be assumed that an FEC code applied to the ith parity sub-block generator (e.g., a parity sub-block generator #i 404-i is C(i)). The FEC code C(i) may define a relationship between the K(i) information payloads and the K(i) parity payloads.

The information block generator 405 inputs the source block output from the source block generator 401, generates an information block by performing an information block generation operation corresponding to a preset information block generation scheme on the source block, and outputs the generated information block to the parity block generator 406. The information block generation scheme may be one of various information block generation schemes, and a detailed description of the information block generation scheme will be omitted.

The parity block generator 406 inputs the information block output from the information block generator 405, generates a parity block by performing a parity block generation operation corresponding to a preset parity block generation scheme on the information block, and outputs the generated parity block to the FEC parity packet generator 407. The parity block generation scheme may be one of various parity block generation schemes, and a detailed description of the parity block generation scheme will be omitted.

The FEC parity packet generator 407 inputs S parity sub-blocks output from each of the parity sub-block generator #1 404-1, the parity sub-block generator #2 404-2, . . . , the parity sub-block generator #S 404-S and a parity block output from the parity block generator 406, and generates an FEC parity packet using the S parity sub-blocks and parity payloads included in the parity block.

The FEC source packet generator 408 inputs the source block 410 output from the source block generator 401, and generates an FEC source packet using source payloads included in the source block 410. The FEC source packet generator 408 generates an FEC source packet corresponding to a preset FEC source packet generation scheme, and a detailed description of the preset FEC source packet generation scheme will be omitted.

While the source block generator 401, the SSB generator 402, the S information sub-block generators, the S parity sub-block generators, the information block generator 405, the parity block generator 406, the FEC parity packet generator 407 and the FEC source packet generator 408 are shown in FIG. 4 as separate units, it is to be understood that this is for merely convenience of description. In other words, two or more of the source block generator 401, the SSB generator 402, the S information sub-block generators, the S parity sub-block generators, the information block generator 405, the parity block generator 406, the FEC parity packet generator 407 and the FEC source packet generator 408 may be incorporated into a single unit.

Figure 5:
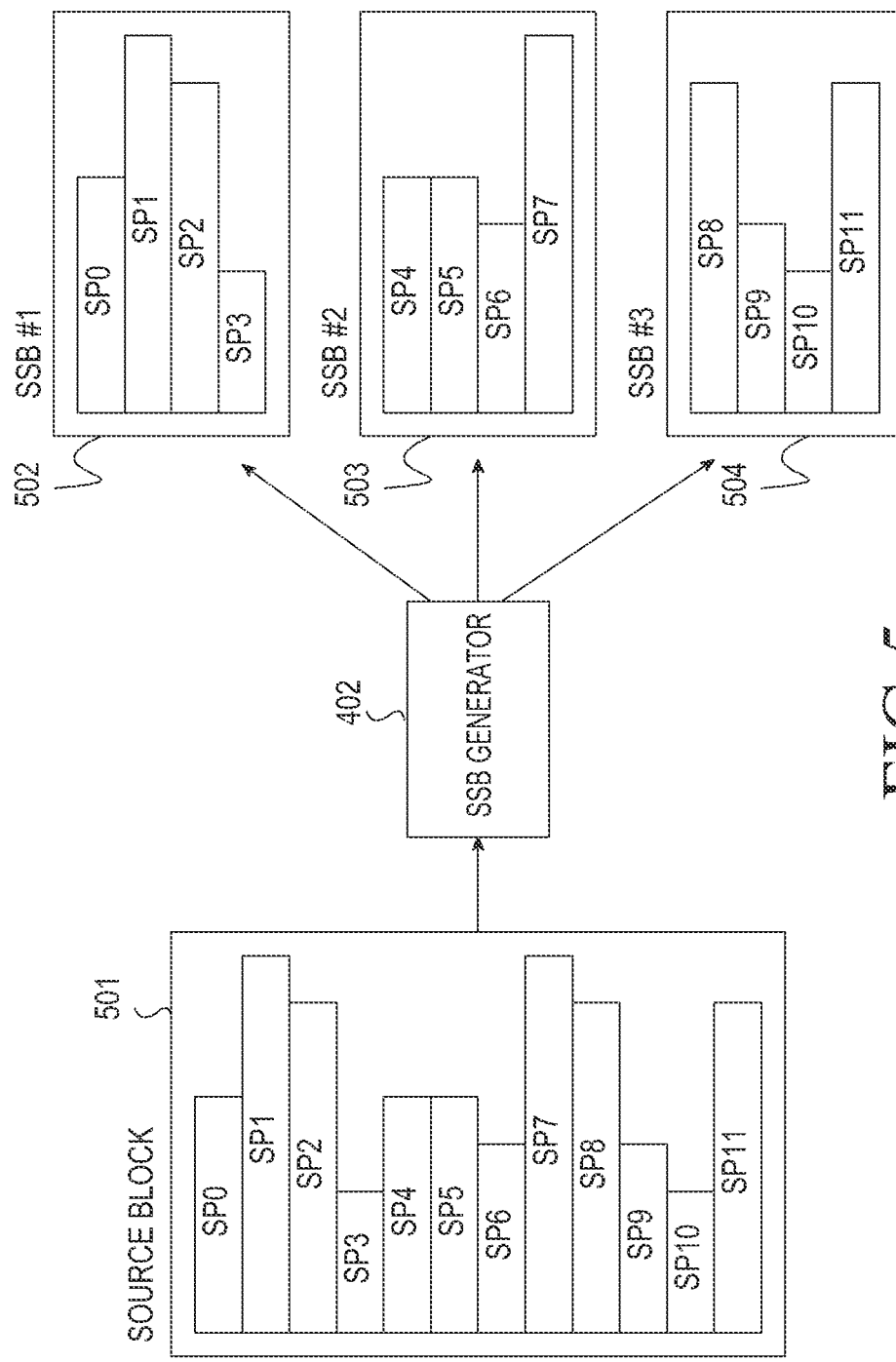
FIG. 5 schematically illustrates an example of a process for generating Source Sub-Block (SSB) in an SSB generator such as, for example, the SSB generator illustrated in FIG. 4 according to an embodiment of the present disclosure.

FIG. 5 schematically illustrates an example of a process for generating an SSB in an SSB generator such as, for example, the SSB generator illustrated in FIG. 4 according to an embodiment of the present disclosure.

Referring to FIG. 5, the SSB generator 402 inputs a source block 501 that is output from a source block generator 401. For convenience, the source block 501 is described in relation to source block 410 illustrated in FIG. 4. For example, for convenience, the source block 501 of FIG. 5 corresponds to the source block 410 of FIG. 4.

The source block 501 includes 12 source payloads (e.g., a source payload SP0, a source payload SP1, . . . , a source payload SP11). The SSB generator 402 generates 3 SSBs (e.g., an SSB 1 502, an SSB 2 503, and an SSB 3 504) by dividing the 12 source payloads. The SSB 1 502 includes 4 source payloads (e.g., a source payload SP0, a source payload SP1, a source payload SP2, and a source payload SP3), the SSB 2 503 includes 4 source payloads (e.g., a source payload SP4, a source payload SP5, a source payload SP6, and a source payload SP7), and the SSB 3 504 includes 4 source payloads (e.g., a source payload SP8, a source payload SP9, a source payload SP10, and a source payload SP11). In other words, SSB 1 502={SP0, SP1, SP2, SP3}, SSB 2 503={SP4, SP5, SP6, SP7}, SSB 3 504={SP8, SP9, SP10, SP11}.

A process for generating the SSBs in the SSB generator 402 will be considered using an equation.

If a source block SB is divided into S SSBs SSB(1), SSB(2), . . . , SSB(S), a relationship corresponding to a following SSB generation rule 1 is established.

[SSB Generation Rule 1]

1) for integers i, j among all integers from 1 to S, an intersection of an SSB(i) and an SSB(j) is an empty set.

2) a union of an SSB(1), an SSB(2), . . . , an SSB(S) is a subset of an SB.

Figure 6:
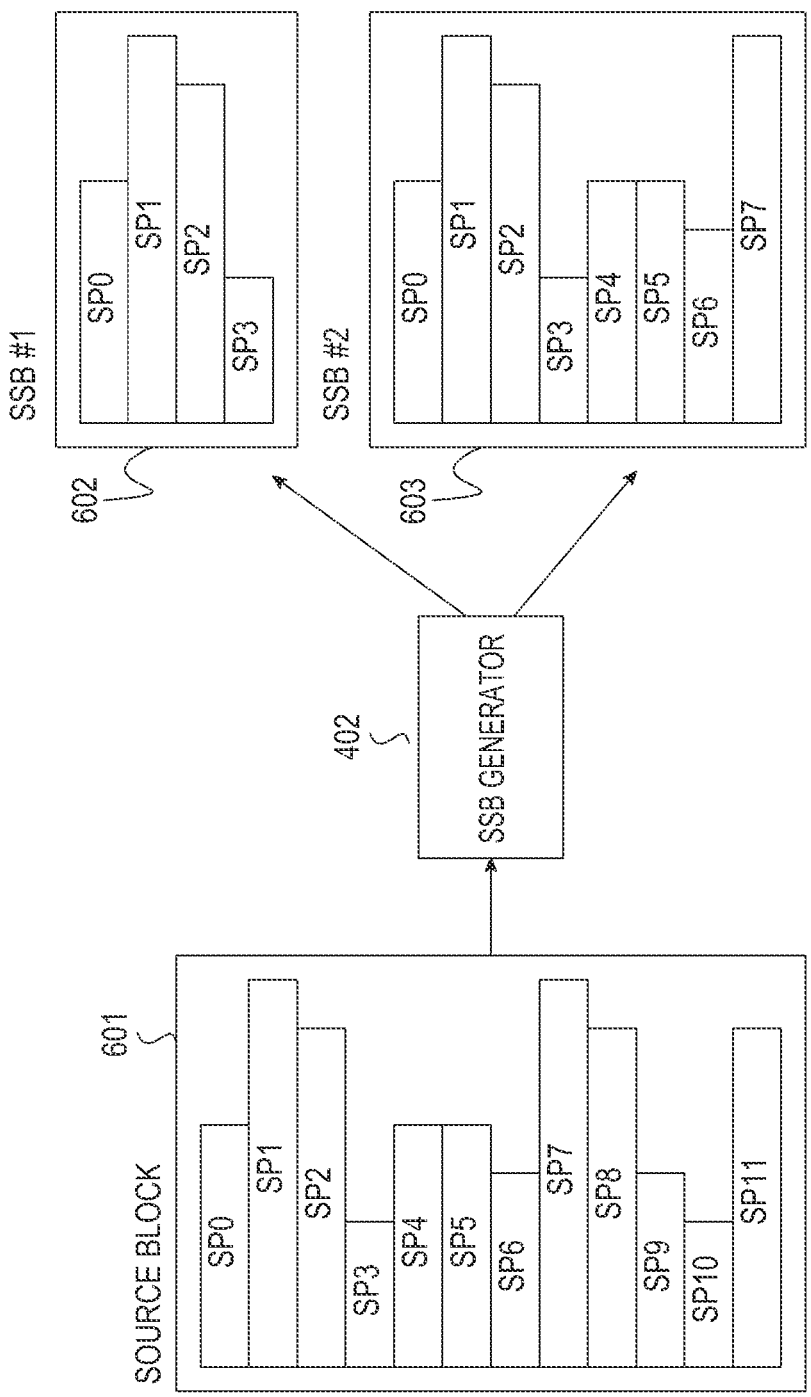
FIG. 6 schematically illustrates an example of a process for generating an SSB in an SSB generator such as, for example, the SSB generator illustrated in FIG. 4 according to an embodiment of the present disclosure.

FIG. 6 schematically illustrates an example of a process for generating an SSB in an SSB generator such as, for example, the SSB generator illustrated in FIG. 4 according to an embodiment of the present disclosure.

Referring to FIG. 6, the SSB generator 402 inputs a source block 601 output from a source block generator 401. For convenience, the source block 601 is described in relation to source block 410 illustrated in FIG. 4. For example, for convenience, the source block 601 of FIG. 6 corresponds to the source block 410 of FIG. 4.

The source block 601 includes 12 source payloads (e.g., a source payload SP0, a source payload SP1, . . . , a source payload SP11). The SSB generator 402 generates 2 SSBs (e.g., an SSB 1 602 and an SSB 2 603) by dividing the 12 source payloads. The SSB 1 602 includes 4 source payloads (e.g., a source payload SP0, a source payload SP1, a source payload SP2, and a source payload SP3), and the SSB 2 603 includes 8 source payloads (e.g., a source payload SP0, a source payload SP1, a source payload SP2, and a source payload SP3, a source payload SP4, a source payload SP5, a source payload SP6, and a source payload SP7). In other words, SSB 1 602={SP0, SP1, SP2, SP3}, SSB 2 603={SP0, SP1, SP2, SP3, SP4, SP5, SP6, SP7}.

A process for generating the SSBs in the SSB generator 402 will be considered using an equation.

If a source block SB is divided into S SSBs SSB(1), SSB(2), . . . , SSB(S), a relationship corresponding to a following SSB generation rule 2 is established.

[SSB Generation Rule 2]

1) for integers i, j among all integers from 1 to S−1, an intersection of an SSB(i) and an SSB(i+1) is the SSB(i).

2) an SSB(S) is a subset of an SB.

Referring to FIG. 3 and FIG. 4, the information block generator 405 inputs the source block 410, and generates an information block with a format as described in FIG. 3 using the source block 410. In this case, T, T(1), . . . , T(S) in FIG. 4 may be different from one another.

According to various embodiments of the present disclosure, the information block generator 405 may generate one information block by concatenating S information sub-blocks which are generated in S information sub-block generators (e.g., an information sub-block generator #1 403-1, an information sub-block generator #2 403-2, . . . , an information sub-block generator #S 403-S). In this case, there is a limitation criterion T=T(1)= . . . =T(S).

A payload size T and the number of regions m used in the information block generator 405 may be determined based on a reliability criterion as to which content included in a source block input in the information block generator 405 require a memory limitation of an FEC decoder, a limitation of FEC decoding recovery delay, and the like.

Like the preceding, T(i) and m(i) used in the ith information sub-block generator may be determined based on a reliability criterion as to which content included in an SSB input in the ith information sub-block require a memory limitation of an FEC decoder, a limitation of FEC decoding recovery delay, and the like. If the content included in the SSB are content which require high reliability, a usage of an FEC code with a robust error correction code capability is required, a detailed description will be followed.

Generally, an error correction capability of an FEC code is enhanced as a length of an FEC codeword becomes increased. If a value of T decreases in a case that a given source block or SSB is converted into an information block, the number of information payloads included in an information block becomes increased. For example, if the number of information payloads included in an information block becomes increased, a more robust FEC code may be used.

Each SSB is a subset of a source block. Accordingly, each SSB includes data less than data of the source block. Therefore, K(i)(i=1, . . . , S) has a value less than K if T=T(1)= . . . =T(S).

According to various embodiments of the present disclosure, T(i) may be expressed as Equation (1).

$$T(i)=T\hat{\ }a, a=-1, -2, -3, \ldots \qquad \text{Equation (1)}$$

Where, T^a denotes the power of T.

In another embodiment of the present disclosure, T(i) may be expressed as Equation (2).

$$T(i)=T/b, b=1, 2, 3, \ldots \qquad \text{Equation (2)}$$

Figure 7:
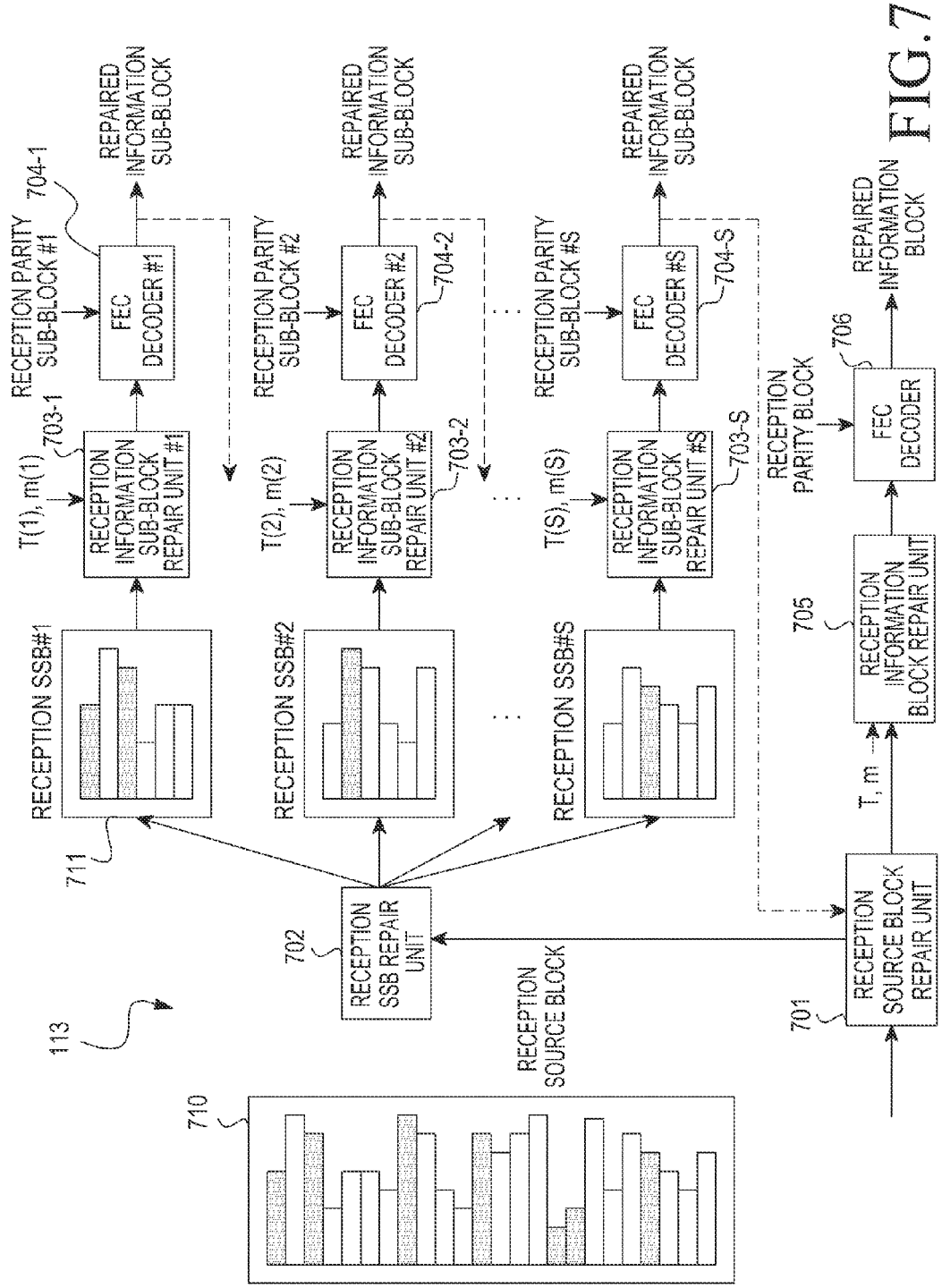
FIG. 7 schematically illustrates an example of an inner structure of an FEC decoding block in a signal reception apparatus such as, for example, the signal reception apparatus illustrated in FIG. 1 according to an embodiment of the present disclosure.

FIG. 7 schematically illustrates an example of an inner structure of an FEC decoding block in a signal reception apparatus such as, for example, the signal reception apparatus illustrated in FIG. 1 according to an embodiment of the present disclosure.

Referring to FIG. 7, the FEC decoding block 113 includes a reception source block repair unit 701, a reception SSB repair unit 702, S reception information sub-block repair units (e.g., a reception information sub-block repair unit #1 703-1, a reception information sub-block repair unit #2 703-2, . . . , a reception information sub-block repair unit #S 703-S), S FEC decoders (e.g., an FEC decoder #1 704-1, an FEC decoder #2 704-2, . . . , an FEC decoder #S 704-S), a reception information block repair unit 705, and an FEC decoder 706.

The reception source block repair unit 701 repairs a reception source block 710 by analyzing an FEC header included in an FEC source packet received through the signal reception apparatus 110, and outputs the repaired reception source block 710 to the reception SSB repair unit 702 and the reception information block repair unit 705.

The reception SSB repair unit 702 inputs the reception source block 710 that is output from the reception source block repair unit 701, generates S reception SSBs (e.g., a reception SSB #1 711-1, a reception SSB #2 711-2, . . . , a reception SSB #5 711-S) by selecting source payloads included in the reception source block 710, and outputs the generated S reception SSBs to a related reception information sub-block repair unit. For example, the reception SSB repair unit 702 outputs the reception SSB #1 711-1 to the reception information sub-block repair unit #1 703-1, the reception SSB #2 711-2 to the reception information sub-block repair unit #2 703-2, . . . , the reception SSB #S 711-S to the reception information sub-block repair unit #S 703-S. Information used for detecting a reception source block and a reception SSB in which a source payload is included may be acquired from a following FEC header, a scheme for acquiring the information will be described below, so a detailed description will be omitted herein.

A reception information sub-block repair unit #i 703-i as the ith reception information sub-block repair unit among the reception information sub-block repair unit #1 703-1 to the reception information sub-block repair unit #2 703-2, . . . , the reception information sub-block repair unit #S 703-S inputs the ith reception SSB output from the reception SSB repair unit 702 (e.g., a reception SSB #i, repairs a reception information sub-block #i by performing a reception information sub-block repair operation corresponding to a preset reception information sub-block repair scheme on the reception SSB #i), and outputs the repaired reception SSB #i to a related FEC decoder (e.g., an FEC decoder #i 704-i). The reception information sub-block repair unit #i 703-i may perform an operation identical to an operation performed by a reception information sub-block repair unit #i 403-i as described in relation to FIG. 4. A payload size and the number of regions necessary for the operation may be acquired through a protocol which transmits a following FEC header or control information, a scheme for acquiring the payload size and the number of regions will be followed. Accordingly, a detailed description thereof will be omitted herein.

Some of FEC packets transmitted from the signal transmission apparatus 100 are lost due to an effect of network congestion and an error occurred on a physical layer. As a result, some of the FEC packets transmitted from the signal transmission apparatus 100 are not transferred to the FEC decoding block 113. Consequently, unlike the signal transmission apparatus 100, some of payloads may not be recognized for the reception source block 710, the S reception SSBs (e.g., the reception SSB #1 711-1, the reception SSB #2 711-2, . . . , the reception SSB #S 711-S). Therefore, for generally generating reception SSBs, a region from which data may be not acquired is processed as an erasure, so the processed region is transferred to the S FEC decoders (i.e., the FEC decoder #1 704-1, the FEC decoder #2 704-2, . . . , the FEC decoder #S 704-S).

The FEC decoder #i 704-i as the ith FEC decoder among the FEC decoder #1 704-1, the FEC decoder #2 704-2, . . . , the FEC decoder #S 704-S attempts to repair the lost transmission FEC packet using a reception information sub-block #i and a parity payload for an information sub-block #i which is acquired from an FEC parity packet (e.g., a reception parity sub-block #i). A relationship between a parity payload included in the FEC parity packet and an FEC code may be a following FEC header, the relationship will be described, so a detailed description will be omitted herein.

The reception information block repair unit 705 inputs the reception source block 710 output from the reception source block repair unit 701, repairs a reception information block by performing a reception information block repair operation corresponding to a preset reception information block repair scheme, and outputs the repaired reception information block to the FEC decoder 706.

The FEC decoder 706 attempts to repair a lost part using the reception information block output from the reception information block repair unit 705 and a parity payload for an acquired information block acquired from an FEC parity packet (e.g., a reception parity block), and outputs the repaired information block.

Upon applying an FEC scheme which uses a source block division proposed in various embodiments of the present disclosure, the signal transmission apparatus 100 may transfer information indicating that each source payload is included in which source block, the number of divided regions included in an information block and an information sub-block, and information indicating each source payload starts from which region of which information payload to the signal reception apparatus 110.

In a case that the signal reception apparatus 110 does not acquire the information indicating that each source payload is included in which source block, the number of divided regions included in the information block and the information sub-block, and the information indicating each source payload starts from which region of which information payload, if arbitrary FEC source packets are lost, then the signal reception apparatus 110 has difficulty performing an FEC decoding operation because the signal reception apparatus 110 may not recognize that the arbitrary FEC source packets are arranged in which location within a source block.

Meanwhile, signaling information on information indicating that each source payload is included in which SSB, a symbol size T and the number of divided regions m may be transmitted by being added to each FEC source packet or through an additional packet. A scheme for transmitting the signaling information through the additional packet will be followed.

Upon transmitting FEC associated information using a Content Delivery Protocol (CDP) such as a Session Description Protocol (SDP), the signal transmission apparatus 100 may transmit information indicating a relationship between a source block and an SSB, T, T(1), . . . , T(S), and m, m(1), . . . , m(S) to the signal reception apparatus 110, or transmit a part of the information indicating the relationship between the source block and the SSB, T, T(1), . . . , T(S), and m, m(1), . . . , m(S) to the signal reception apparatus 110. If T is not a multiple of m, the signal reception apparatus 110 may detect the number of columns included in each region using T and m based on a preset promise between the signal transmission apparatus 100 and the signal reception apparatus 110 (e.g., in order that a upper layer includes [T/m]+1 columns and a lower layer includes [T/m] columns).

The signal transmission apparatus 100 should transmit information in order for the signal reception apparatus 110 to recognize a format by which a source payload is arranged within an information block and an information sub-block, so a detailed description will be followed.

In order for the signal reception apparatus 110 to recognize the format by which the source payload is arranged within the information block and the information sub-block, the signal transmission apparatus 100 may add information indicating a location of a row from which each source payload starts (e.g., an order of an FEC encoding symbols and a location of a region from which each source payload starts to each FEC source packet), and transmit each FEC source packet to which the information is added to the signal reception apparatus 110.

An example of signaling information which is added to an FEC source packet according to various embodiments of the present disclosure is expressed in Table 1.

TABLE 1

....
Source Block Number (SBN)
Payload Type
If (Payload type == Source Payload) {
  Encoding Symbol ID (ESI)
  Payload Start Position (PSP)
  Number of associated Source Sub-Blocks(N)
  For i=1 to N {
    Source Sub-Block Number (SSBN(i))
    Encoding Symbol ID for SSBN(i) (ESI(i))
    Packet Start Position for SSBN(i) (PSP(i))
  }
}

TABLE 1-continued

If (Payload type == Parity Payload for Source Block) {
  Encoding Symbol ID (ESI)
  Information Block Length (IBL)
  T, m
}
If (Payload type == Parity Payload for Source Sub-Block) {
  Source Sub-Block Number (SSBN)
  Encoding Symbol ID (ESI)
  Information Sub-Block Length (ISBL)
  T(SSBN), m(SSBN)
}

In Table 1, the signaling information includes a Source Block Number (SBN) and a payload type.

The SBN denotes a source block corresponding to a related FEC packet. The payload type denotes which type of data is included in a payload included in the related FEC packet (e.g., a type of a payload included in the related FEC packet). The payload type may be classified to three types (e.g., a source payload, a parity payload related to a source block, and a parity payload related to an SSB).

The signaling information may further include additional information corresponding to the payload type. A detailed description of the additional information will be is provided below.

Firstly, if the payload type indicates the source payload (payload type=source payload), the signaling information further includes an Encoding Symbol ID (ESI), a Payload Start Position (PSP), a number of associated SSBs (N), and a Source Sub-Block Number (SSBN), an ESI for the SSBN, and a PSP for the SSBN for i=1 to N. In Table 1, an SSBN for the ith SSB is expressed as an SSBN(i), an ESI for the ith SSB is expressed as an ESI(i), and a PSP for the ith SSB is expressed as a PSP(i).

Secondly, if the payload type indicates the parity payload for the source block (payload type=parity payload for source block), the signaling information further includes an ESI, an Information Block Length (IBL), T, and m.

Thirdly, if the payload type indicates the parity payload for the SSB (payload type=parity payload for SSB), the signaling information further includes an SSBN, an ESI, an Information Sub-Block Length (ISBL), T(SSBN), and m(SSBN).

The payload type will be followed with reference to FIG. 1.

Referring to FIG. 1, according to various embodiments of the present disclosure, the payload type is transferred to the protocol B processing block 103 in a form of control information, and the payload type is included in a header of a protocol B in the protocol B processing block 103. In this case, the signaling information in Table 1 may be omitted.

If a payload type of a related FEC packet indicates a source payload, an ESI indicates an initial encoding symbol from which an FEC source packet starts (e.g., a location of a row within an information block), and a PSP indicates a region from which a source payload starts within the information block. Referring to FIG. 3, if m=4, a pair of an ESI value and a PSP value for the first FEC source packet is (0, 0), a pair of an ESI value and a PSP value for the second FEC source packet is (1, 2), a pair of an ESI value and a PSP value for the third FEC source packet is (3, 3), and a pair of an ESI value and a PSP value for the fourth FEC source packet is (6, 1).

The number of SSBs N denotes the number of SSBs including a related FEC source packet. For an integer i from 1 to N, an SSBN(i) denotes an SSB corresponding to a related FEC source packet, an ESI(i) denotes an initial encoding symbol from which an FEC source packet starts (e.g., a location of a row within an information block), and a PSP(i) denotes a region from which a source payload starts within the information block. According to various embodiments of the present disclosure, if the number of SSBs N is a constant value, the number of SSBs N is not repeatedly transmitted per each FEC packet and included in a control signal which is transferred in a system initial process or a service acquisition process in a broadcasting and communication system, so the number of SSBs N may be omitted in Table 1.

If a payload type of a related FEC packet indicates a parity payload related to a source block, the number of SSBs N is 1, a PSP is 0. Consequently, the number of SSBs N and the PSP may be omitted. For example, if a payload type of a related FEC packet indicates a parity payload related to a source block, the number of SSBs N is always 1, a PSP is always 0.

If the number of information payloads included in an information block is K, an ESI of an FEC source packet is sequentially allocated as 0, 1, 2, . . . , (K−1) for each source symbol. However, it will be understood by those of ordinary skill in the art that an ESI of an FEC parity packet may be allocated according to a system requirement of the broadcasting and communication system. For example, an ESI for an FEC parity packet may be sequentially allocated as 0, 1, 2, . . . for each repair symbol like the ESI of the FEC source packet. In this case, an octet size necessary for an ESI of a repair packet may be minimized.

According to various embodiments of the present disclosure, an ESI for each parity symbol may be allocated such as K, (K+1), (K+2), . . . by regarding a repair symbol as an encoding symbol which is concatenated post to a source symbol.

According to various embodiment of the present disclosure, if each source symbol is regarded as m segmentalized symbols because a source block is divided into m regions, then m*K segmentalized symbols exist within one source block. Accordingly, for each repaired symbol, an ESI of an FEC parity packet is sequentially allocated as m*K, (m*K+1), (m*K+2), . . . .

The signal transmission apparatus 100 may indicate an accurate source block structure by transmitting a Source Block Length (SBL) indicating a total number of rows for regions included in a source block, T, and m to the signal reception apparatus 110, and the signal reception apparatus 110 may detect the accurate source block structure transmitted from the signal transmission apparatus 100.

If a payload type of a related FEC packet indicates a parity payload for an SSB, related signaling information is identical to signaling information for a case that the payload type indicates the parity payload for the source block excepting that an ID for the SSB (e.g., an SSBN) is added to the signaling information and additional information is for a related information sub-block.

The FEC header in Table 1 includes minimum information necessary for performing various embodiments of the present disclosure. However, it will be understood by those of ordinary skill in the art that the FEC header may further include additional information according to a system requirement of the broadcasting and communication system.

According to various embodiments of the present disclosure, even though there is a means with a high reliability for transmitting control information, only some of N, T, m, IBL, and ISBL among fields may be transmitted using the means, and an FEC source packet header should include an SBN, an SSBN, an ESI for a related source block, and an ESI for an SSB. An FEC parity packet header should include an SBN and ESI. If a payload type indicates a parity payload for an SSB, an SSBN should be included in an FEC packet header.

According to various embodiments of the present disclosure, a source payload is protected using one or more FEC codes. As a result, a signal reception apparatus may acquire decoding performance improvement by dynamically updating a reception source block on an FEC decoding process.

An operation of the FEC decoding block 113 in the signal reception apparatus 110 in FIG. 1 according to an embodiment of the present disclosure will be described with reference to FIG. 7.

Referring to FIG. 7, in an embodiment of the present disclosure, the reception source block repair unit 701 generates the first reception SSB, the first reception SSB is FEC decoded using an FEC code C(1) (e.g., through the FEC decoder #1 704-1) such that repairing a lost source payload is attempted. If the repaired source payload exists, the reception source block repair unit 701 updates the reception source block, and repairs the second reception source block using the updated reception source block. In this way, a process identical to the process for the first reception SSB is performed up to the Sth reception SSB as the last reception SSB. For example, the Sth reception SSB is FEC decoded using an FEC code C(S) (e.g., through the FEC decoder #S 704-S), such that repairing the lost source payload is attempted.

Lastly, the reception information block repair unit 705 repairs reception information block using the reception source block which is updated using the decoding result for all information sub-blocks and attempts to repair lost source payload using an FEC code C (e.g., through the FEC decoder 706).

According to various embodiments of the present disclosure, the signal reception apparatus 110 may update a reception source block using a decoding result for all information sub-blocks after decoding each SSB, generates an information block using the updated reception source block, and attempt to repair a lost source payload using an FEC code C.

Although the reception source block repair unit 701, the reception SSB repair unit 702, the S reception information sub-block repair units, the S FEC decoders, the reception information block repair unit 705, and the FEC decoder 706 are shown in FIG. 7 as separate units, it is to be understood that such an illustration is for merely convenience of description. In other words, two or more of the reception source block repair unit 701, the reception SSB repair unit 702, the S reception information sub-block repair units, the S FEC decoders, the reception information block repair unit 705, and the FEC decoder 706 may be incorporated into a single unit.

According to various embodiments of the present disclosure, the signaling information in FIG. 1 is added by FEC source packet. However, it will be understood by those of ordinary skill in the art that the signaling information in FIG. 1 may be added by source block not the FEC source packet or may be transmitted from a signal transmission apparatus to a signal reception apparatus through additional signaling. The signaling information may be transmitted at an arbitrary timing point (e.g., a timing point at which an initial connection is set up between the signal transmission apparatus and the signal reception apparatus).

As is apparent from the foregoing description, various embodiments of the present disclosure enable to transmit/receive a packet using an SSB in a broadcasting and communication system.

Various embodiments of the present disclosure enable transmission/reception of a packet in a broadcasting and communication system, thereby increasing data recovery efficiency.

Various embodiments of the present disclosure enable to transmit/receive a packet in a broadcasting and communication system, thereby acquiring effective transmission reliability.

It will be appreciated that various embodiments of the present disclosure according to the claims and description in the specification can be realized in the form of hardware, software or a combination of hardware and software.

Any such software may be stored in a non-transitory computer readable storage medium. The non-transitory computer readable storage medium stores one or more programs (software modules), the one or more programs comprising instructions, which when executed by one or more processors in an electronic device, cause the electronic device to perform a method of the present disclosure.

Any such software may be stored in the form of volatile or non-volatile storage such as, for example, a storage device like a Read Only Memory (ROM), whether erasable or rewritable or not, or in the form of memory such as, for example, Random Access Memory (RAM), memory chips, device or integrated circuits or on an optically or magnetically readable medium such as, for example, a Compact Disk (CD), Digital Versatile Disc (DVD), magnetic disk or magnetic tape or the like. It will be appreciated that the storage devices and storage media are various embodiments of non-transitory machine-readable storage that are suitable for storing a program or programs comprising instructions that, when executed, implement various embodiments of the present disclosure. Accordingly, various embodiments provide a program comprising code for implementing apparatus or a method as claimed in any one of the claims of this specification and a non-transitory machine-readable storage storing such a program.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for transmitting a packet by a signal transmission apparatus in a broadcasting and communication system, the method comprising:
    generating a Forward Error Correction (FEC) packet including an FEC parity packet and an FEC source packet by encoding source payloads using an FEC encoding scheme; and
    transmitting the FEC packet to a signal reception apparatus,
    wherein the FEC parity packet is generated using a plurality of Source Sub-Blocks (SSBs) which are generated using specific source payloads selected corresponding to a preset SSB generation scheme from among the source payloads included in a source block, and
    wherein the FEC source packet is generated using the source payloads.

2. The method of claim 1, wherein, if the plurality of SSBs are S SSBs, where S is an integer, then the S SSBs are generated by performing an SSB generation operation corresponding to an SSB generation rule on the source block, and
    wherein the SSB generation rule includes 1) for integers i, j among all integers from 1 to S, an intersection of an SSB(i) and an SSB(j) is an empty set; and 2) a union of an SSB(1), an SSB(2), . . . , an SSB(S) is a subset of a Source Block (SB), where the SSB(i) denotes the ith SSB, the SSB(j) denotes the jth SSB.

3. The method of claim 1, wherein, if the plurality of SSBs are S SSBs, where S is an integer, then the S SSBs are generated by performing an SSB generation operation corresponding to an SSB generation rule on the source block, and
    wherein the SSB generation rule includes 1) for integers i, j among all integers from 1 to S−1, an intersection of an SSB(i) and an SSB(i+1) is the SSB(i); and 2) an SSB(S) is a subset of a Source Block (SB), where the SSB(i) denotes the ith SSB, the SSB(i+1) denotes the i+1th SSB.

4. The method of claim 1, wherein the generating of the FEC packet including the FEC parity packet and the FEC source packet by encoding the source payloads using the FEC encoding scheme comprises:
    generating the source block including the source payloads; and
    generating the plurality of SSBs by performing an SSB generation operation corresponding to the SSB generation scheme on the source block.

5. The method of claim 4, wherein the generating of the plurality of SSBs by performing the SSB generation operation corresponding to the SSB generation scheme on the source block comprises:
    generating S SSBs by performing an SSB generation operation corresponding to an SSB generation rule on the source block if the plurality of SSBs are the S SSBs, where S is an integer,
    wherein the SSB generation rule includes 1) for integers i, j among all integers from 1 to S, an intersection of an SSB(i) and an SSB(j) is an empty set; and 2) a union of an SSB(1), an SSB(2), . . . , an SSB(S) is a subset of a Source Block (SB), where the SSB(i) denotes the ith SSB, the SSB(j) denotes the jth SSB.

6. The method of claim 4, wherein the generating of the plurality of SSBs by performing the SSB generation operation corresponding to the SSB generation scheme on the source block comprises:
    generating S SSBs by performing an SSB generation operation corresponding to an SSB generation rule on the source block if the plurality of SSBs are the S SSBs, where S is an integer,
    wherein the SSB generation rule includes 1) for integers i, j among all integers from 1 to S−1, an intersection of an SSB(i) and an SSB(i+1) is the SSB(i); and 2) an SSB(S) is a subset of a Source Block (SB), where the SSB(i) denotes the ith SSB, the SSB(i+1) denotes the i+1th SSB.

7. The method of claim 1, wherein the source payloads included in the source block are arranged in a form of a two-dimension array with a preset payload size T, the two-dimension array is divided into m regions by T/m columns, and if the plurality of SSBs are S SSBs, then T(i) may be expressed as, $$T(i)=T^a, a=-1, -2, -3, \ldots -S$$

where, T(i) denotes a payload size applied to the ith SSB among the S SSBs, and $T^a$ denotes the power of T.

8. The method of claim 1, wherein the source payloads included in the source block are arranged in a form of a two-dimension array with a preset payload size T, the two-dimension array is divided into m regions by T/m columns, and if the plurality of SSBs are S SSBs, then T(i) may be expressed as, $$T(i)=T/b,\ b=1,\ 2,\ 3,\ \ldots\ S$$

where, T(i) denotes a payload size applied to the ith SSB among the S SSBs.

9. The method of claim 1, wherein the FEC source packet includes signaling information including a Source Block Number (SBN) indicating a source block corresponding to a related FEC packet, and a payload type indicating a type of a payload included in the related FEC packet.

10. The method of claim 9, wherein if the payload type indicates a source payload, the signaling information further includes an Encoding Symbol ID (ESI), a Payload Start Position (PSP), a number of associated SSBs (N), and a Source Sub-Block Number (SSBN), an ESI for a related SSBN, and a PSP for the related SSBN for i=1 to N, wherein if the payload type indicates a parity payload for a source block, the signaling information further includes an ESI, an Information Block Length (IBL), T, and m, wherein if the payload type indicates a parity payload for an SSB, the signaling information further includes an SSBN, and an ESI, an Information Sub-Block Length (ISBL), T(SSBN), and m(SSBN), and wherein the T denotes a preset payload size, the m denotes a number of regions which are generated by dividing a two-dimension array with the T by T/m columns, and the source payloads included in the source block are arranged in a form of the two-dimension array with the T.

11. A method for receiving a packet by a signal reception apparatus in a broadcasting and communication system, the method comprising:

receiving a Forward Error Correction (FEC) packet including an FEC parity packet and an FEC source packet from a signal transmission apparatus, wherein the FEC parity packet is generated using a plurality of Source Sub-Blocks (SSBs) which are generated using specific source payloads selected corresponding to a preset SSB generation scheme from among the source payloads included in a source block, and wherein the FEC source packet is generated using the source payloads.

12. The method of claim 11, wherein, if the plurality of SSBs are S SSBs, where S is an integer, then the S SSBs are generated by performing an SSB generation operation corresponding to an SSB generation rule on the source block, and wherein the SSB generation rule includes 1) for integers i, j among all integers from 1 to S, an intersection of an SSB(i) and an SSB(j) is an empty set; and 2) a union of an SSB(1), an SSB(2), . . . , an SSB(S) is a subset of a Source Block (SB), where the SSB(i) denotes the ith SSB, the SSB(j) denotes the jth SSB.

13. The method of claim 11, wherein, if the plurality of SSBs are S SSBs, where S is an integer, then the S SSBs are generated by performing an SSB generation operation corresponding to an SSB generation rule on the source block, and wherein the SSB generation rule includes 1) for integers i, j among all integers from 1 to S−1, an intersection of an SSB(i) and an SSB(i+1) is the SSB(i); and 2) an SSB(S) is a subset of a Source Block (SB), where the SSB(i) denotes the ith SSB, the SSB(i+1) denotes the i+1th SSB.

14. The method of claim 11, wherein the source payloads included in the source block are arranged in a form of a two-dimension array with a preset payload size T, the two-dimension array is divided into m regions by T/m columns, and if the plurality of SSBs are S SSBs, then T(i) may be expressed as, $$T(i)=T\hat{\ }a,\ a=-1,\ -2,\ -3,\ \ldots\ -S$$

where, T(i) denotes a payload size applied to the ith SSB among the S SSBs, and T^a denotes the power of T.

15. The method of claim 11, wherein the source payloads included in the source block are arranged in a form of a two-dimension array with a preset payload size T, the two-dimension array is divided into m regions by T/m columns, and if the plurality of SSBs are S SSBs, then T(i) may be expressed as, $$T(i)=T/b,\ b=1,\ 2,\ 3,\ \ldots\ S$$

where, T(i) denotes a payload size applied to the ith SSB among the S SSBs.

16. The method of claim 11, wherein the FEC source packet includes signaling information including a Source Block Number (SBN) indicating a source block corresponding to a related FEC packet, and a payload type indicating a type of a payload included in the related FEC packet.

17. The method of claim 16, wherein if the payload type indicates a source payload, the signaling information further includes an Encoding Symbol ID (ESI), a Payload Start Position (PSP), a number of associated SSBs (N), and a Source Sub-Block Number (SSBN), an ESI for a related SSBN, and a PSP for the related SSBN for i=1 to N, wherein if the payload type indicates a parity payload for a source block, the signaling information further includes an ESI, an Information Block Length (IBL), T, and m, wherein if the payload type indicates a parity payload for an SSB, the signaling information further includes an SSBN, and an ESI, an Information Sub-Block Length (ISBL), T(SSBN), and m(SSBN), and wherein the T denotes a preset payload size, the m denotes a number of regions which are generated by dividing a two-dimension array with the T by T/m columns, and the source payloads included in the source block are arranged in a form of the two-dimension array with the T.

18. A signal transmission apparatus in a broadcasting and communication system, the signal transmission apparatus comprising:

a Forward Error Correction (FEC) encoding block configured to generate an FEC packet including an FEC parity packet and an FEC source packet by encoding source payloads using an FEC encoding scheme; and a transmitter configured to transmit the FEC packet to a signal reception apparatus, wherein the FEC parity packet is generated using a plurality of Source Sub-Blocks (SSBs) which are generated using specific source payloads selected corresponding to a preset SSB generation scheme from among the source payloads included in a source block, and wherein the FEC source packet is generated using the source payloads.

19. The signal transmission apparatus of claim 18, wherein, if the plurality of SSBs are S SSBs, where S is an integer, then the S SSBs are generated by performing an SSB generation operation corresponding to an SSB generation rule on the source block, and wherein the SSB generation rule includes 1) for integers i, j among all integers from 1 to S, an intersection of an SSB(i) and an SSB(j) is an empty set; and 2) a union of an SSB(1), an SSB(2), . . . , an SSB(S) is a subset of a Source Block (SB), where the SSB(i) denotes the ith SSB, the SSB(j) denotes the jth SSB.

20. The signal transmission apparatus of claim 18, wherein, if the plurality of SSBs are S SSBs, where S is an integer, then the S SSBs are generated by performing an SSB generation operation corresponding to an SSB generation rule on the source block, and wherein the SSB generation rule includes 1) for integers i, j among all integers from 1 to S−1, an intersection of an SSB(i) and an SSB(i+1) is the SSB(i); and 2) an SSB(S) is a subset of a Source Block (SB), where the SSB(i) denotes the ith SSB, the SSB(i+1) denotes the i+1th SSB.

21. The signal transmission apparatus of claim 18, wherein the FEC encoding block generates the source block including the source payloads, and generates the plurality of SSBs by performing an SSB generation operation corresponding to the SSB generation scheme on the source block.

22. The signal transmission apparatus of claim 21, wherein the FEC encoding block generates S SSBs by performing an SSB generation operation corresponding to an SSB generation rule on the source block if the plurality of SSBs are the S SSBs, where S is an integer, wherein the SSB generation rule includes 1) for integers i, j among all integers from 1 to S, an intersection of an SSB(i) and an SSB(j) is an empty set; and 2) a union of an SSB(1), an SSB(2), . . . , an SSB(S) is a subset of a Source Block (SB), where the SSB(i) denotes the ith SSB, the SSB(j) denotes the jth SSB.

23. The signal transmission apparatus of claim 21, wherein the FEC encoding block generates S SSBs by performing an SSB generation operation corresponding to an SSB generation rule on the source block if the plurality of SSBs are the S SSBs, where S is an integer, wherein the SSB generation rule includes 1) for integers i, j among all integers from 1 to S−1, an intersection of an SSB(i) and an SSB(i+1) is the SSB(i); and 2) an SSB(S) is a subset of a Source Block (SB), where the SSB(i) denotes the ith SSB, the SSB(i+1) denotes the i+1th SSB.

24. The signal transmission apparatus of claim 18, wherein the source payloads included in the source block are arranged in a form of a two-dimension array with a preset payload size T, the two-dimension array is divided into m regions by T/m columns, and if the plurality of SSBs are S SSBs, then T(i) may be expressed as, $T(i)=T\hat{}a, a=-1, -2, -3, \ldots -S$ where, T(i) denotes a payload size applied to the ith SSB among the S SSBs, and T^a denotes the power of T.

25. The signal transmission apparatus of claim 18, wherein the source payloads included in the source block are arranged in a form of a two-dimension array with a preset payload size T, the two-dimension array is divided into m regions by T/m columns, and if the plurality of SSBs are S SSBs, then T(i) may be expressed as, $T(i)=T/b, b=1, 2, 3, \ldots S$ where, T(i) denotes a payload size applied to the ith SSB among the S SSBs.

26. The signal transmission apparatus of claim 18, wherein the FEC source packet includes signalling information including a Source Block Number (SBN) indicating a source block corresponding to a related FEC packet, and a payload type indicating a type of a payload included in the related FEC packet.

27. The signal transmission apparatus of claim 26, wherein if the payload type indicates a source payload, the signaling information further includes an Encoding Symbol ID (ESI), a Payload Start Position (PSP), a number of associated SSBs (N), and a Source Sub-Block Number (SSBN), an ESI for a related SSBN, and a PSP for the related SSBN for i=1 to N, wherein if the payload type indicates a parity payload for a source block, the signaling information further includes an ESI, an Information Block Length (IBL), T, and m, wherein if the payload type indicates a parity payload for an SSB, the signaling information further includes an SSBN, and an ESI, an Information Sub-Block Length (ISBL), T(SSBN), and m(SSBN), and wherein the T denotes a preset payload size, the m denotes a number of regions which are generated by dividing a two-dimension array with the T by T/m columns, and the source payloads included in the source block are arranged in a form of the two-dimension array with the T.

28. A signal reception apparatus in a broadcasting and communication system, the signal reception apparatus comprising:

a receiver configured to receive a Forward Error Correction (FEC) packet including an FEC parity packet and an FEC source packet from a signal transmission apparatus, wherein the FEC parity packet is generated using a plurality of Source Sub-Blocks (SSBs) which are generated using specific source payloads selected corresponding to a preset SSB generation scheme from among the source payloads included in a source block, and wherein the FEC source packet is generated using the source payloads.

29. The signal reception apparatus of claim 28, wherein, if the plurality of source sub-blocks are S SSBs, where S is an integer, then the S SSBs are generated by performing an SSB generation operation corresponding to an SSB generation rule on the source block, and wherein the SSB generation rule includes 1) for integers i, j among all integers from 1 to S, an intersection of an SSB(i) and an SSB(j) is an empty set; and 2) a union of an SSB(1), an SSB(2), . . . , an SSB(S) is a subset of a Source Block (SB), where the SSB(i) denotes the ith SSB, the SSB(j) denotes the jth SSB.

30. The signal reception apparatus of claim 28, wherein, if the plurality of SSBs are S SSBs, where S is an integer, then the S SSBs are generated by performing an SSB generation operation corresponding to an SSB generation rule on the source block, and wherein the SSB generation rule includes 1) for integers i, j among all integers from 1 to S−1, an intersection of an SSB(i) and an SSB(i+1) is the SSB(i); and 2) an SSB(S) is a subset of a Source Block (SB), where the SSB(i) denotes the ith SSB, the SSB(i+1) denotes the i+1th SSB.

31. The signal reception apparatus of claim 28, wherein the source payloads included in the source block are arranged in a form of a two-dimension array with a preset payload size T, the two-dimension array is divided into m regions by T/m columns, and if the plurality of SSBs are S SSBs, then T(i) may be expressed, $$T(i)=T\hat{\ }a, \ a=-1, -2, -3, \ldots -S$$

where, T(i) denotes a payload size applied to the ith SSB among the S SSBs, and T^a denotes the power of T.

32. The signal reception apparatus of claim 28, wherein the source payloads included in the source block are arranged in a form of a two-dimension array with a preset payload size T, the two-dimension array is divided into m regions by T/m columns, and if the plurality of SSBs are S SSBs, then T(i) may be expressed as, $$T(i)=T/b, \ b=1, 2, 3, \ldots S$$

where, T(i) denotes a payload size applied to the ith SSB among the S SSBs.

33. The signal reception apparatus of claim 28, wherein the FEC source packet includes signaling information including a Source Block Number (SBN) indicating a source block corresponding to a related FEC packet, and a payload type indicating a type of a payload included in the related FEC packet.

34. The signal reception apparatus of claim 33, wherein if the payload type indicates a source payload, the signaling information further includes an Encoding Symbol ID (ESI), a Payload Start Position (PSP), a number of associated SSBs (N), and a Source Sub-Block Number (SSBN), an ESI for a related SSBN, and a PSP for the related SSBN for i=1 to N, wherein if the payload type indicates a parity payload for a source block, the signaling information further includes an ESI, an Information Block Length (IBL), T, and m, wherein if the payload type indicates a parity payload for an SSB, the signaling information further includes an SSBN, and an ESI, an Information Sub-Block Length (ISBL), T(SSBN), and m(SSBN), and wherein the T denotes a preset payload size, the m denotes a number of regions which are generated by dividing a two-dimension array with the T by T/m columns, and the source payloads included in the source block are arranged in a form of the two-dimension array with the T.

\* \* \* \* \*